(12) United States Patent
Koizumi

(10) Patent No.: US 7,665,050 B2
(45) Date of Patent: Feb. 16, 2010

(54) SEMICONDUCTOR DEVICE VERIFICATION SYSTEM AND SEMICONDUCTOR DEVICE FABRICATION METHOD

(75) Inventor: Ryoji Koizumi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 37 days.

(21) Appl. No.: 11/640,231

(22) Filed: Dec. 18, 2006

(65) Prior Publication Data
US 2008/0010623 A1 Jan. 10, 2008

(30) Foreign Application Priority Data
Jul. 4, 2006 (JP) ............................. 2006-184722

(51) Int. Cl.
*G06F 17/50* (2006.01)
(52) U.S. Cl. .................... 716/5; 716/1; 716/4; 716/18
(58) Field of Classification Search .................... 716/1, 716/4, 5, 18
See application file for complete search history.

(56) References Cited
U.S. PATENT DOCUMENTS
2006/0090146 A1* 4/2006 LeBritton et al. ............ 716/4

OTHER PUBLICATIONS
Patent Abstract of Japan, Japanese Publication No. 2004,013264, Published Jan. 15, 2004. (1pg).
Patent Abstract of Japan, Japanese Publication No. 02-082637, Published Mar. 23, 1990. (1pg).
Patent Abstract of Japan, Japanese Publication No. 03-022459, Published Jan. 30, 1991. (1pg).
* cited by examiner

*Primary Examiner*—Thuan Do
(74) *Attorney, Agent, or Firm*—Fujitsu Patent Center

(57) ABSTRACT

A semiconductor device verification system capable of verifying operation with great accuracy. A pattern matching verification system outputs interference pattern information. A physical verification system compiles the interference pattern information and a design rule and extracts a design rule applied to the interference pattern information. The physical verification system then refers to the design rule to verify a compared cell list and the interference pattern information. As a result, the physical verification system can perform physical verification of layout data without skipping data regarding the compared cell list.

20 Claims, 10 Drawing Sheets

SEMICONDUCTOR DEVICE VERIFICATION SYSTEM AND SEMICONDUCTOR DEVICE FABRICATION METHOD

CROSS-REFERENCE TO RELATED APPLICATIONS

This application is based upon and claims the benefits of priority from the prior Japanese Patent Application No. 2006-184722, filed on Jul. 4, 2006, the entire contents of which are incorporated herein by reference.

BACKGROUND OF THE INVENTION (1) Field of the Invention

This invention relates to a semiconductor device verification system and a semiconductor device fabrication method and, more particularly, to a semiconductor device verification system for verifying layout data generated by the layout design of a semiconductor device and a semiconductor device fabrication method.

(2) Description of the Related Art

For example, the number of transistors included in large-scale integration (LSI) was about a thousand at first. With the progress of semiconductor technology, however, ten million to several hundred million transistors can be formed in LSI at present.

In addition, LSI design was made mainly by hand at first. However, there is a limit to design made by hand because of such a rise in the integration level of LSI. As a result, automatic design made not by hand but by a computer is used. In recent years an automatic design development tool called an electronic design automatic (EDA) is used for LSI design by a computer (see Japanese Patent Laid-Open Publication No. 2004-13264).

LSI design for which the EDA is used includes processes such as functional and logical design and layout design. LSI design for which the EDA is used will be described in brief.

First, in the functional and logical design a hardware description language (HDL) such as the Verilog-HDL is used for generating a logic circuit which meets the operation specifications of desired LSI. Whether the generated logic circuit is logically equal to the desired LSI described in the hardware description language is verified.

If no problem arises when the logic circuit generated by the functional and logical design is verified in this way, then layout design is performed on the logic circuit.

With LSI, transistors are formed by performing processes, such as epitaxial growth, ion implantation, ion diffusion, and etching, on a silicon wafer. When these transistors are formed, a mask corresponding to a treatment pattern is needed in each process. One mask is used in each process.

FIGS. 8 and 9 are schematic views showing a hierarchy of data for a chip layout.

In the layout design, as shown in FIGS. 8 and 9, a chip 100 is divided into small portions (cells) according to functional or logical unit instead of making a layout design for the entire chip 100. After each cell obtained by the division is located at an arbitrary position, cells are wired. By doing so, a layout is performed hierarchically. As a result, the layout of the chip 100 is performed and mask pattern data (layout data) used for fabricating the LSI is generated. The LSI is fabricated on the basis of the layout data.

After that, validity is checked from the viewpoint of fabrication. For example, whether the LSI is correctly fabricated on the basis of the layout data generated by the layout design and whether the LSI fabricated correctly functions are checked.

FIG. 10 is a schematic view showing a conventional physical verification system.

As shown in FIG. 10, whether layout data 201 generated by the layout design satisfies a standard rule for general LSI (design rule 202) is verified by the use of a physical verification system 205.

For example, the following case may occur. A static random access memory (SRAM) can actually be fabricated, but data which does not follow the design rule 202 is included. In this case, such data is set in advance in an excluded cell list 203 as an excluded cell. When verification is performed, the physical verification system 205 skips data included in the excluded cell list 203 of the layout data 201. As a result, a process is simplified by the amount of the data which the physical verification system 205 skips and verification efficiency rises.

The layout data 201 generated by the layout design is verified by the above verification method. Error data which is a verification result is outputted as a summary file 206. The contents of the error data depend on the physical verification system 205 used.

The physical verification system 205 is a design rule check (DRC) which verifies whether the layout data 201 generated satisfies the design rule 202, a layout versus schematic (LVS) which verifies whether the result of the layout design matches the result of circuit design, or the like.

The integration level of LSI is rising. Such LSI can efficiently be designed not by hand but by the EDA.

However, the physical verification system which performs a process by skipping the data included in the excluded cell list of the layout data has the following problems.

A process is simplified by skipping the data included in the excluded cell list. This is based on the premise that the data set as an excluded cell is not changed. Even if the data set as an excluded cell is changed, a process is performed by skipping the data. Accordingly, a change of the cell is not detected.

One of solutions for this problem is a layout versus layout (LVL). With this verification method, pattern matching of layout data generated by layout design and layout data for general LSI is performed to check that there is no differential between them. Of the layout data generated, a tier including an excluded cell and tiers lower than the tier including the excluded cell are usually verified in the case of the LVL. Therefore, if interference such as a wiring from the outside exists at a tier higher than the excluded cell, the interference cannot be detected.

It is necessary to wire each cell of a layout and the outside. Accordingly, each cell of the layout always suffers interference of some kind. However, the excluded cell is skipped when a process is performed. As a result, whether the interference which the excluded cell suffers from the outside is necessary is not checked.

One of solutions for this problem is to set an interference prohibition area in the excluded cell or to set a new design rule for detecting interference, for the purpose of checking whether the interference which the excluded cell suffers is necessary. However, if an interference prohibition area is set, the area of the layout increases, complexity increases because of, for example, a need to consider the achievement of a balance between the interference prohibition area and an interference permissible area, and the possibility of an increase in processing time and a deterioration in verification accuracy increases.

Furthermore, in a circuit information extraction process in which the LVS is used as a physical verification system, a method for designating a tier at which the extraction of circuit information compared with circuit information for general LSI begins traditionally exists. However, interference may occur between data corresponding to a tier higher than a designated cell and data corresponding to a tier at which extraction begins. In this case, the above method does not show which tier data that causes the interference belongs to. As a result, a processing method is indefinite and a user's purpose may not be realized.

In addition, if an element has, for example, a complicated shape, it is difficult to extract circuit information by a physical verification system in accordance with a conventional design rule. Wiring layers of an inductor are located so as to form a spiral. For example, if the LVS is used as a physical verification system, it is very difficult to extract the number of turns from layout data. If up-to-date technologies are used, information regarding various portions is extracted as parameters in order to increase accuracy with which various parameters of a transistor are extracted. However, it is very difficult to describe these parameters as a design rule and extract a matching result. If the DRC is used as a physical verification system, a cell for which a layout shape itself must be specified exists. For example, an analog element must have a specific shape from the viewpoints of a manufacturing yield and a characteristic assurance. However, a design rule is represented mainly by the minimum or maximum value of a pattern itself or a correlation. That is to say, a design rule is not suitable for specifying a shape itself. Therefore, it is very difficult to specify a shape by a design rule.

If various kinds of cells are located on one chip, design rules on these cells may differ from one another. In such a case, criteria for these design rules may interfere with one another. Moreover, there may be need to permit deviation from a design rule in a specific cell. In these cases, the setting of an excluded cell and interference which the excluded cell suffers must additionally be verified. As stated above, however, many problems arise if verification is conducted with the excluded cell taken into consideration.

SUMMARY OF THE INVENTION

The present invention was made under the background circumstances described above. An object of the present invention is to provide a semiconductor device verification system capable of verifying layout design with great accuracy and a semiconductor device fabrication method.

In order to achieve the above object, a semiconductor device verification system for verifying layout data generated by the layout design of a semiconductor device is provided. This semiconductor device verification system comprises a pattern matching verification system for performing adaptability verification of the layout data and comparison reference layout data including layout data for general semiconductor integrated circuits about data included in a compared cell list including a cell extracted from the layout data and for outputting an adaptability verification result and interference pattern information, and a physical verification system for extracting an interference pattern design rule applied to the interference pattern information from a design rule for the general semiconductor integrated circuits, for outputting a verification result obtained by verifying the layout data, the interference pattern information, and the compared cell list with the interference pattern design rule, for extracting inadaptable layout data not adaptable to the compared cell list and adaptable layout data adaptable to the compared cell list from the layout data by performing adaptability verification of the compared cell list and the layout data, and for outputting a verification result obtained by verifying the inadaptable layout data and the adaptable layout data with the design rule.

In addition, in order to achieve the above object, a semiconductor device fabrication method comprising a process performed by a pattern matching verification system and including the steps of performing adaptability verification of layout data and comparison reference layout data including layout data for general semiconductor integrated circuits about data included in a compared cell list including a cell extracted from the layout data and outputting an adaptability verification result and interference pattern information and a process performed by a physical verification system and including the steps of extracting an interference pattern design rule applied to the interference pattern information from a design rule for the general semiconductor integrated circuits, outputting a verification result obtained by verifying the layout data, the interference pattern information, and the compared cell list with the interference pattern design rule, extracting inadaptable layout data not adaptable to the compared cell list and adaptable layout data adaptable to the compared cell list from the layout data by performing adaptability verification of the compared cell list and the layout data, and outputting a verification result obtained by verifying the inadaptable layout data and the adaptable layout data with the design rule.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENT

An embodiment of the present invention will now be described in detail with reference to the drawings.

An overview of the present invention will be described first.

Figure 1:
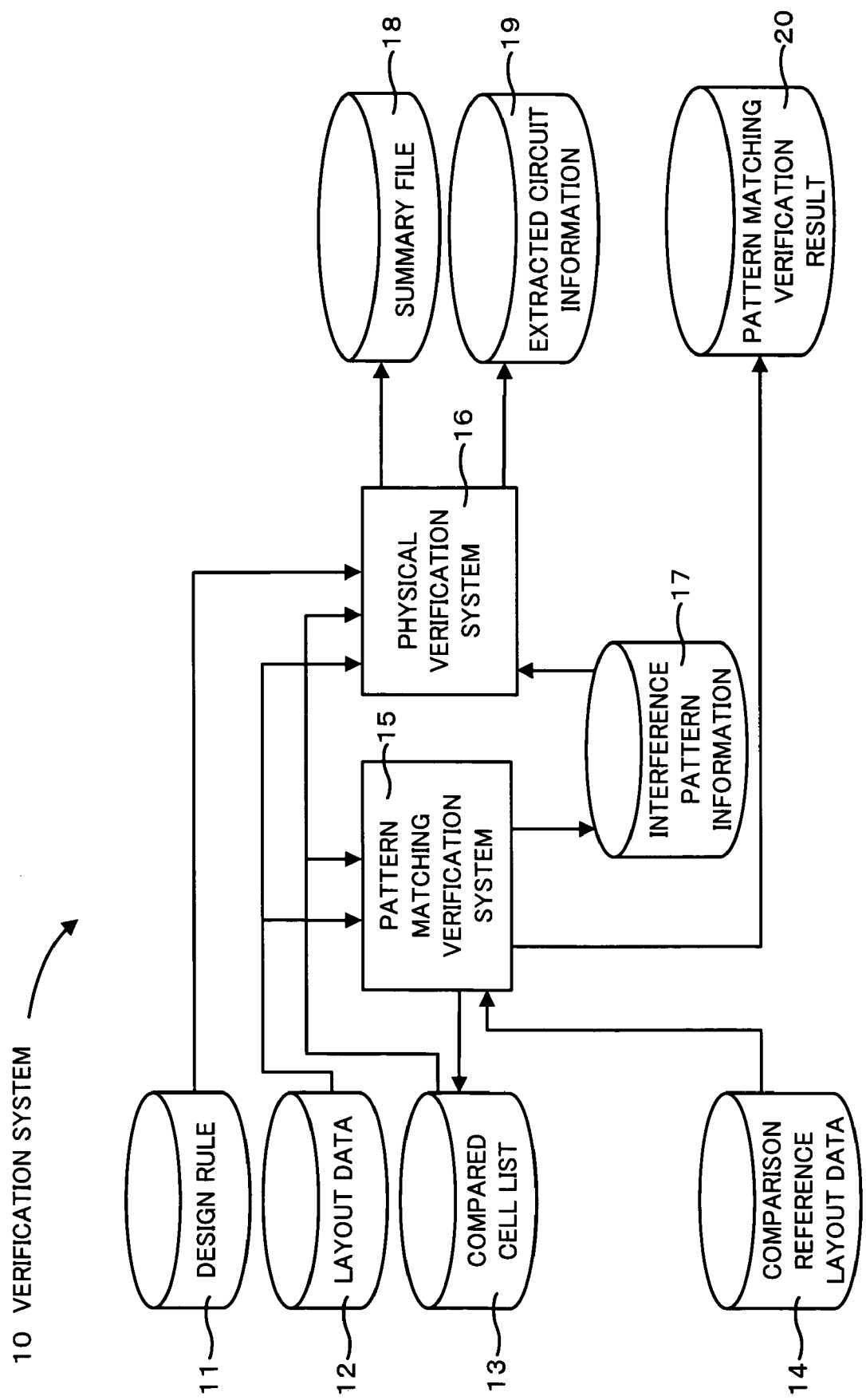
FIG. 1 is a schematic view showing a verification system according to the present invention.
Figure 2:
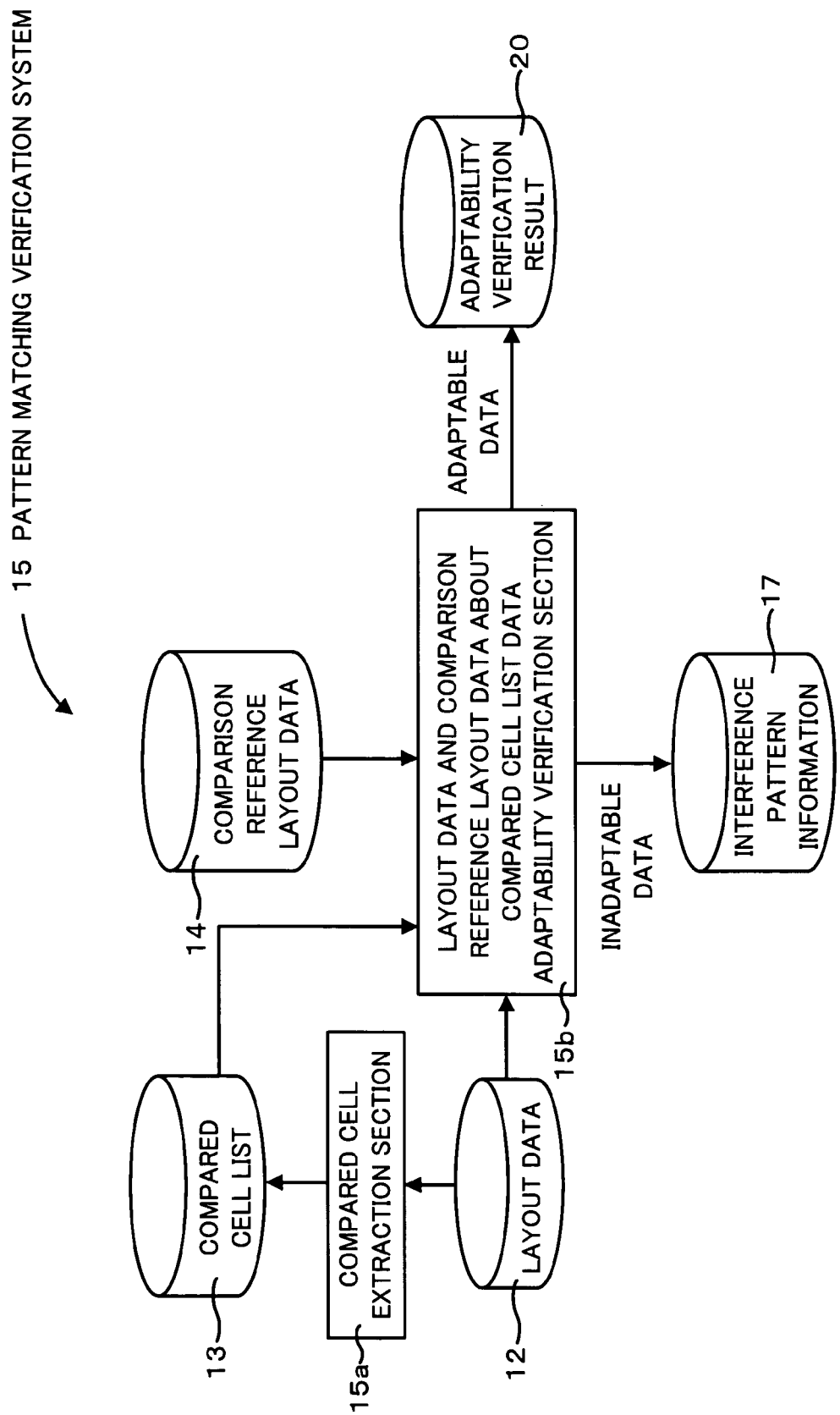
FIG. 2 is a schematic view showing a pattern matching verification system.
Figure 3:
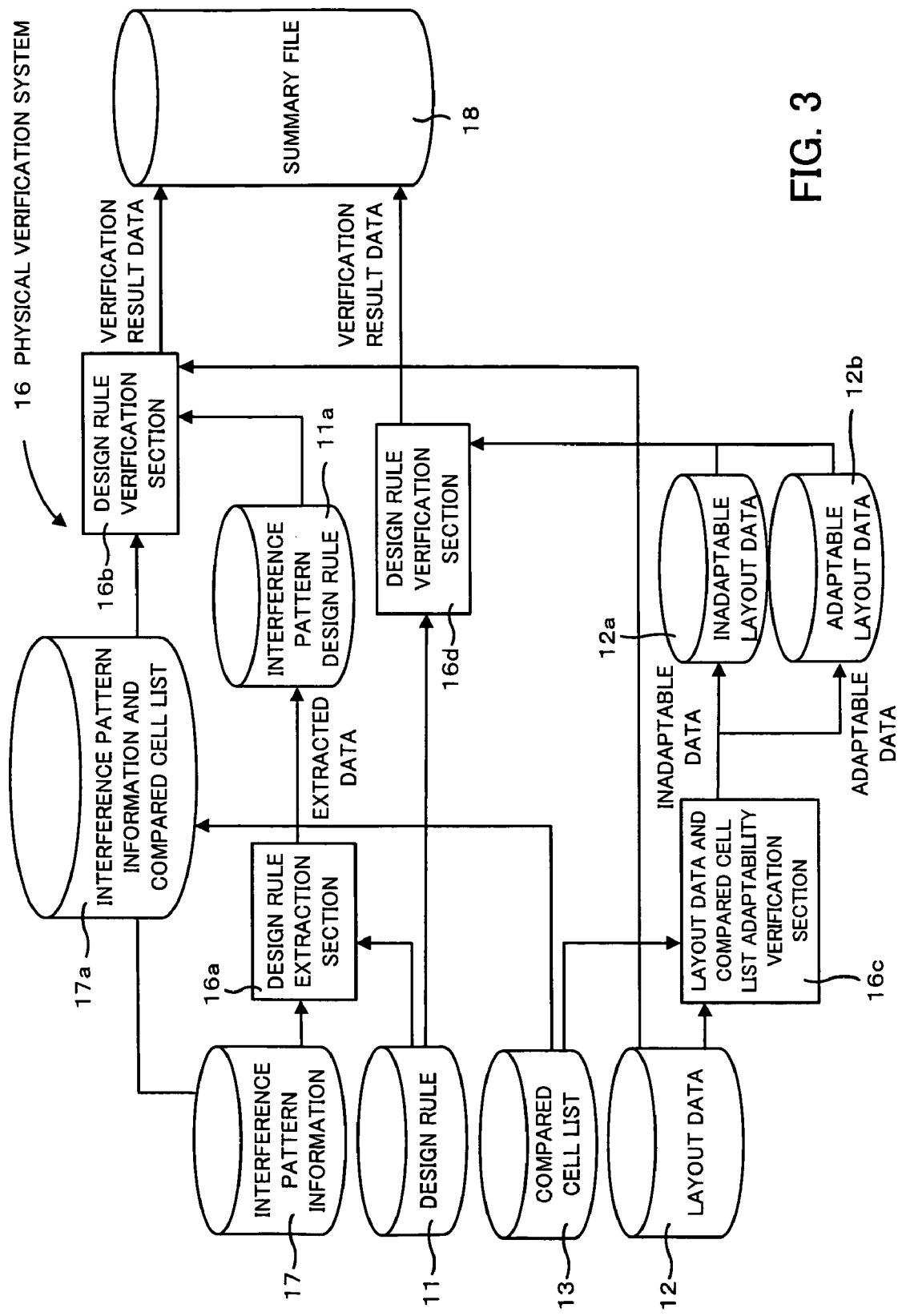
FIG. 3 is a schematic view showing a physical verification system.

FIG. 1 is a schematic view showing a verification system according to the present invention. FIG. 2 is a schematic view showing a pattern matching verification system. FIG. 3 is a schematic view showing a physical verification system. FIG.

4 is a schematic view showing a semiconductor integrated circuit designed on the basis of layout data.

Figure 5:
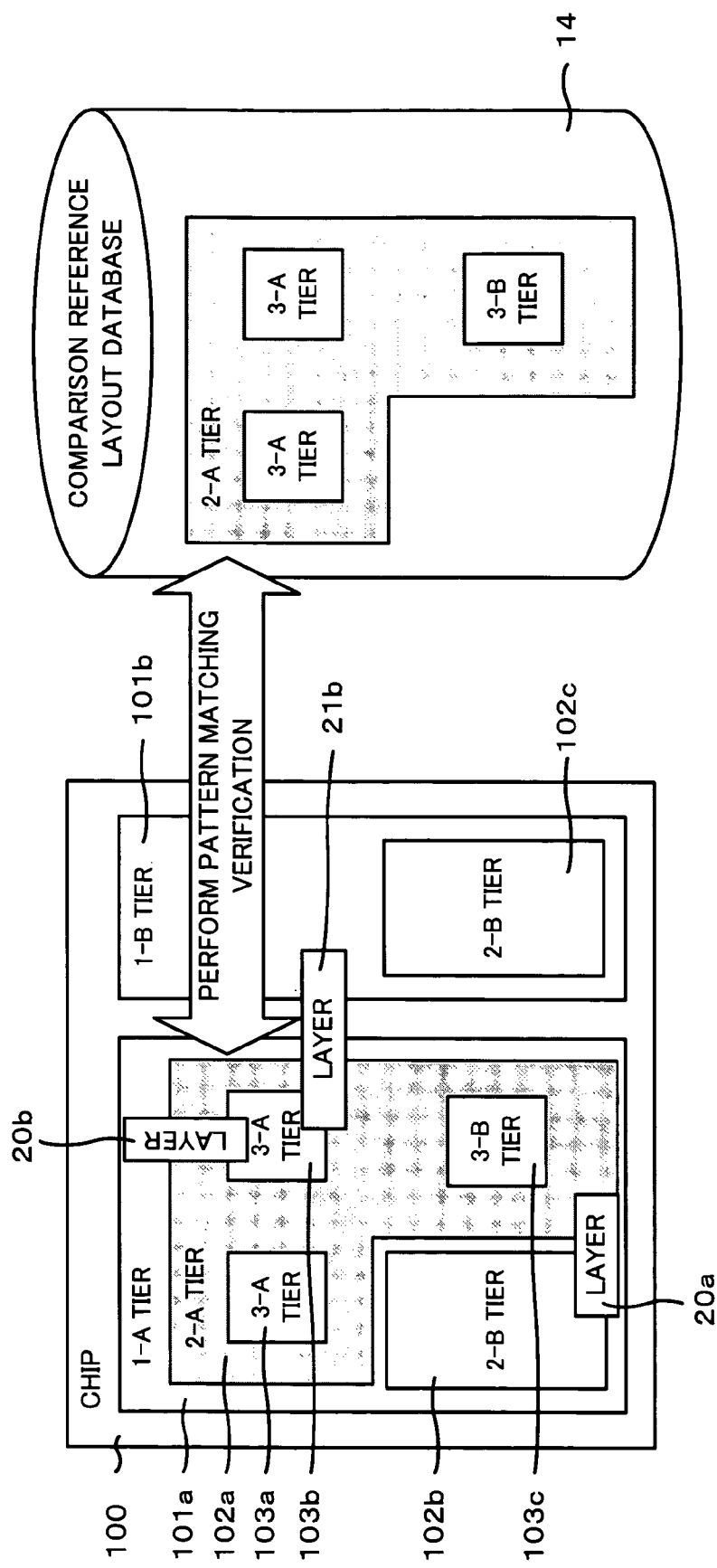
FIG. 5 is a schematic view showing an embodiment of the present invention (part 1).
Figure 6:
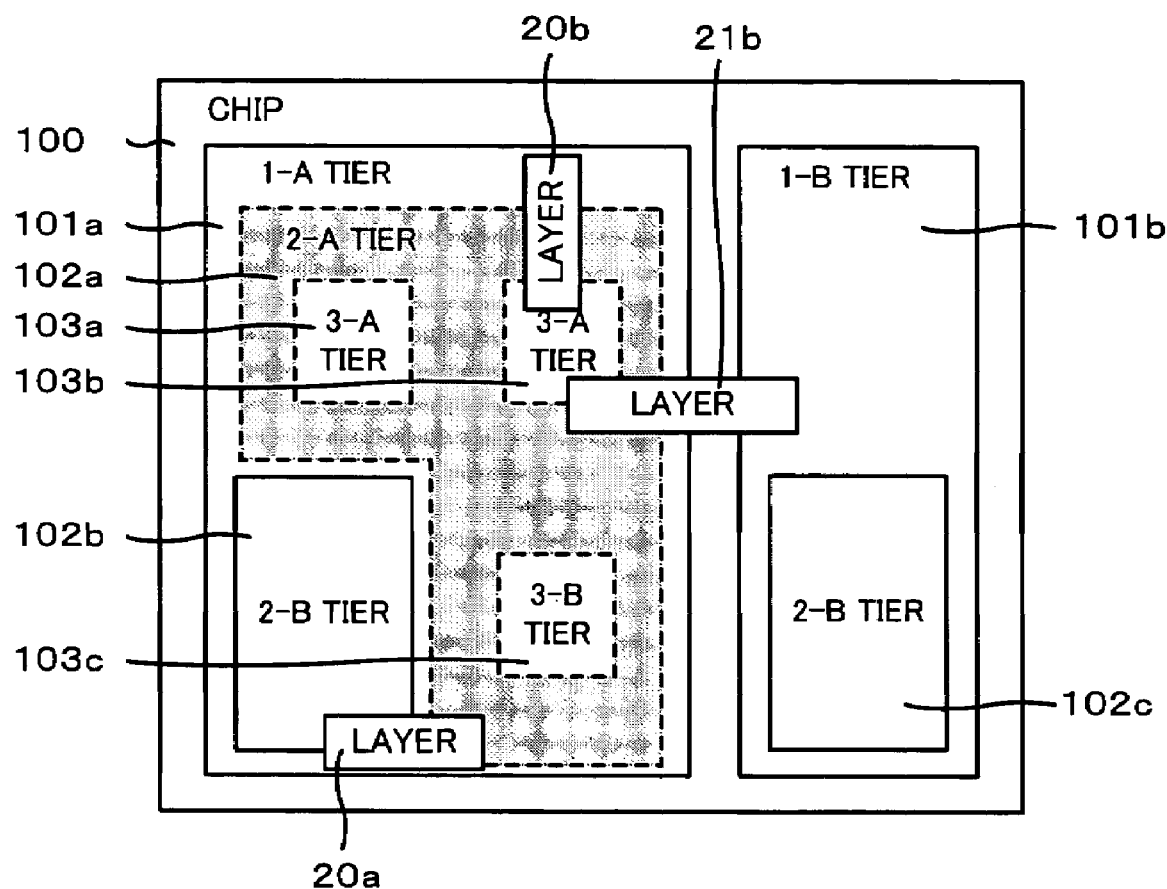
FIG. 6 is a schematic view showing the embodiment of the present invention (part 2).
Figure 7:
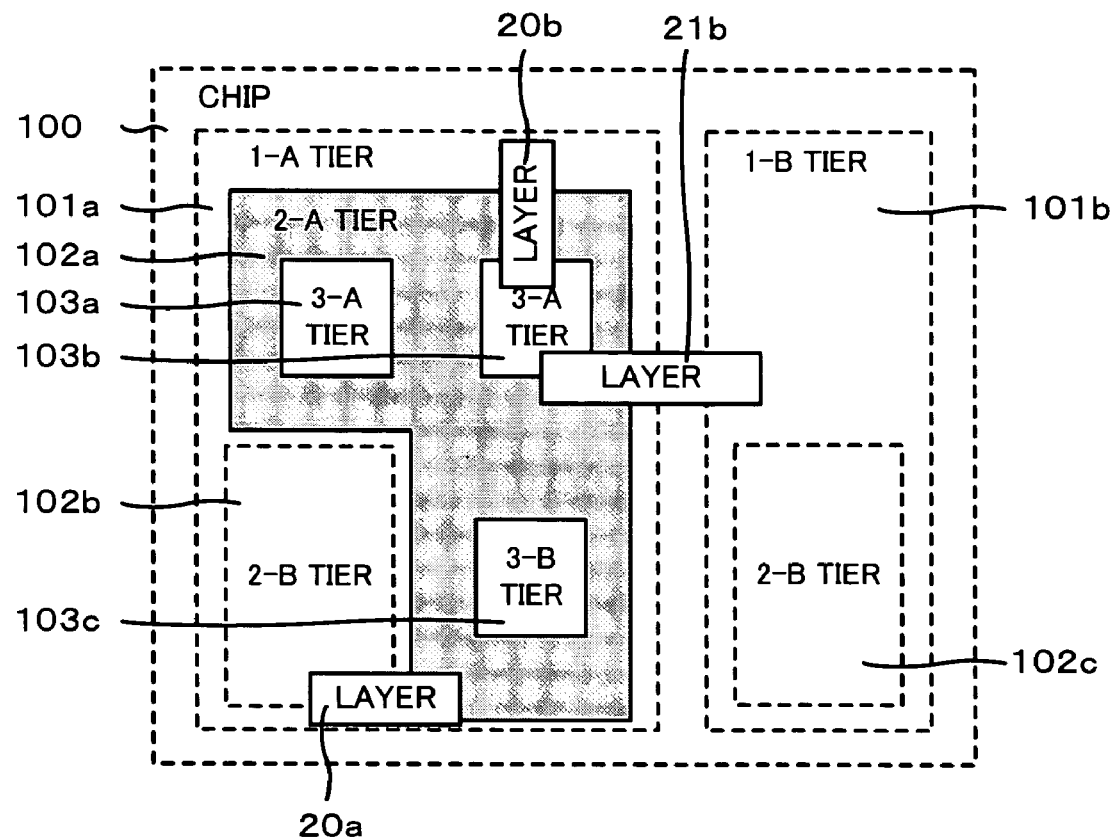
FIG. 7 is a schematic view showing the embodiment of the present invention (part 3).
Figure 8:
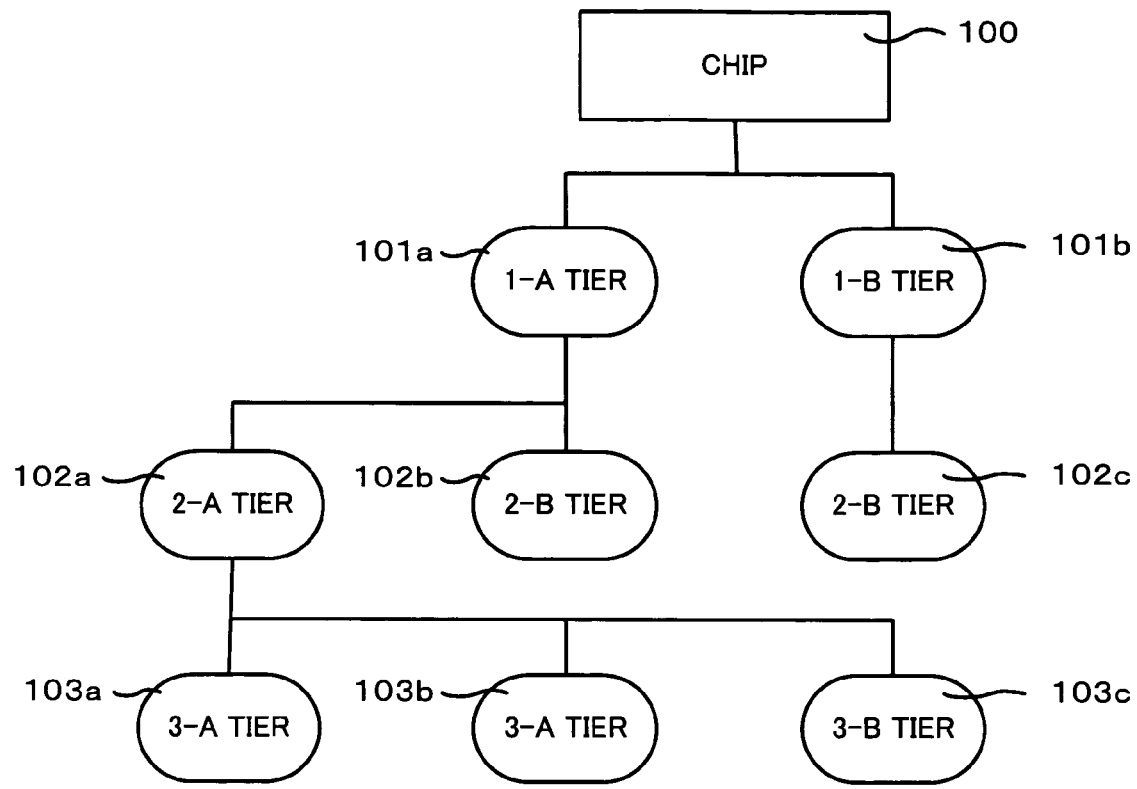
FIG. 8 is a schematic view showing a hierarchy of data for a chip layout (part 1).
Figure 9:
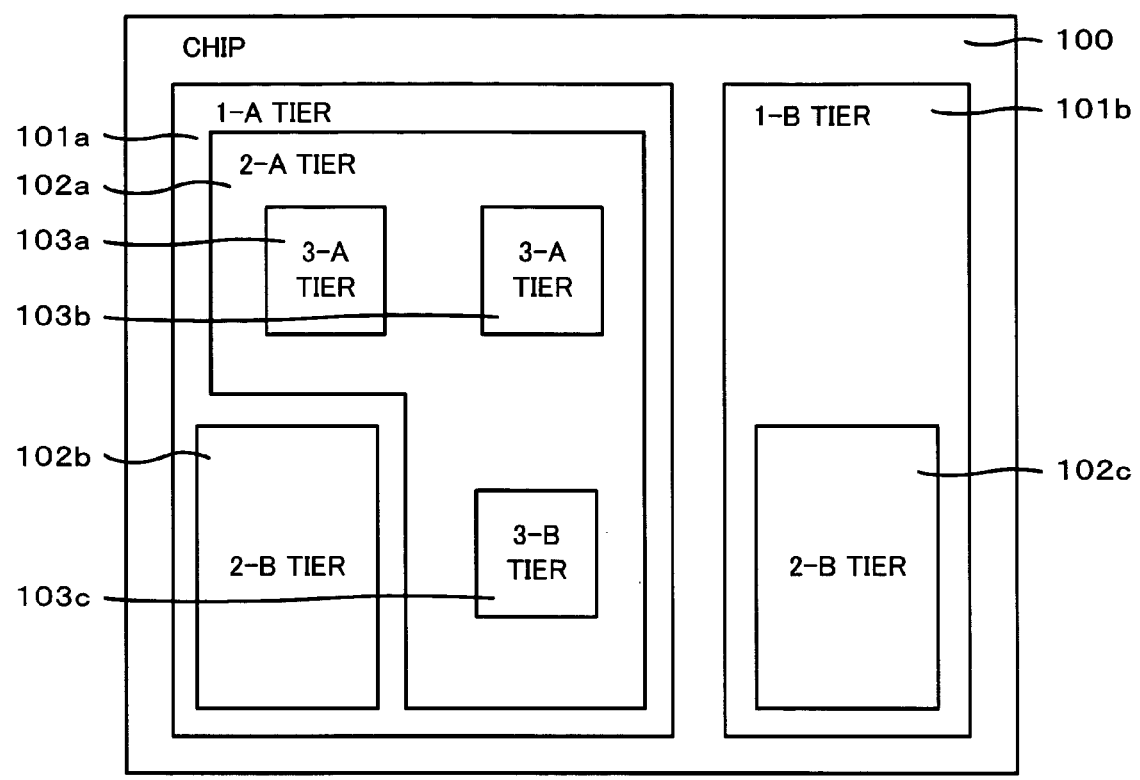
FIG. 9 is a schematic view showing the hierarchy of the data for the chip layout (part 2).
Figure 10:
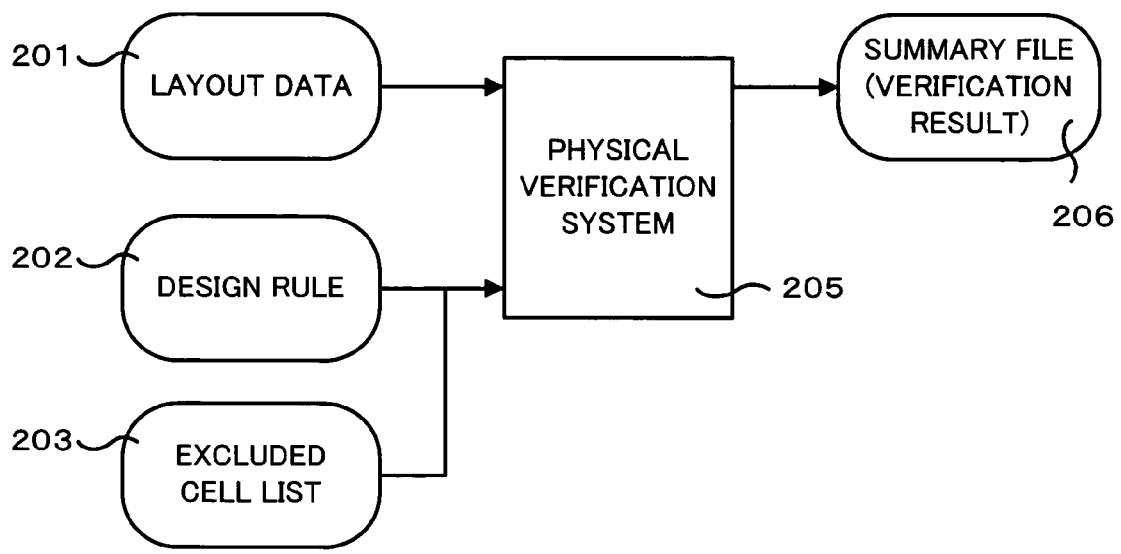
FIG. 10 is a schematic view showing a conventional physical verification system.

FIGS. 5 through 7 are schematic views showing an embodiment of the present invention.

Figure 4:
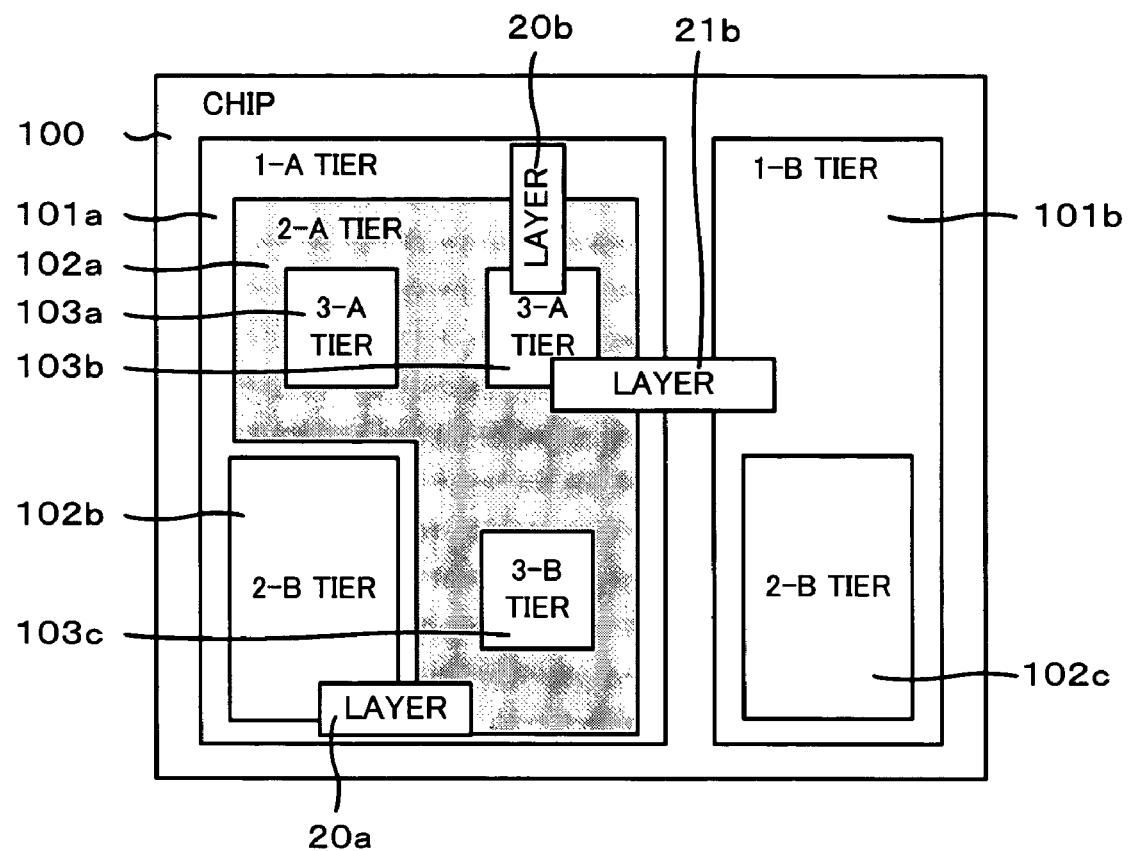
FIG. 4 is a schematic view showing a semiconductor integrated circuit designed on the basis of layout data.

As shown in FIG. 1, a verification system 10 according to the present invention comprises a pattern matching verification system 15 and a physical verification system 16 in order to verify layout data 12 generated by layout design. The pattern matching verification system 15 extracts interference pattern information 17. The physical verification system 16 also verifies the interference pattern information 17. As shown in FIG. 4, the layout data 12 indicates a chip 100 hierarchically laid out. It is assumed that a 2-A tier 102a is a designated cell.

The verification system according to the present invention will now be described in detail.

As shown in FIG. 2, processes performed by the pattern matching verification system 15 will be described first.

A compared cell extraction section 15a extracts a cell compared later with comparison reference layout data 14 from the layout data 12 and constructs a compared cell list 13 including data for the cell. It is assumed that the cell compared with the comparison reference layout data 14 is data including the designated cell 2-A tier 102a and tiers lower than the designated cell 2-A tier 102a.

The layout data 12, the comparison reference layout data 14, and the compared cell list 13 are inputted to the pattern matching verification system 15.

As shown in FIG. 5, a layout data and comparison reference layout data about compared cell list data adaptability verification section 15b performs adaptability verification of the layout data 12 and the comparison reference layout data 14 about the cell designated in the compared cell list 13 (in this example, data including the designated cell 2-A tier 102a and the tiers lower than the designated cell 2-A tier 102a) and outputs data in the layout data 12 which is adaptable to the comparison reference layout data 14 as an adaptability verification result 20.

As shown in FIG. 6, on the other hand, outer portions of the designated cell 2-A tier 102a included in the compared cell list 13 and interference patterns (layers 20a, 20b, and 21b, in this example) which overlap the designated cell 2-A tier 102a directly from the outside are extracted from inadaptable data which is included in the layout data 12 and which is not included in the comparison reference layout data 14 as interference pattern information 17.

As shown in FIG. 3, processes performed by the physical verification system 16 will be described next.

The compared cell list 13 and the interference pattern information 17 obtained by the pattern matching verification system 15, a design rule 11, and the layout data 12 are inputted to the physical verification system 16.

In addition to the design rule 11, a design rule extraction section 16a included in the physical verification system 16 extracts a design rule for the interference pattern information 17. That is to say, an interference pattern design rule 11a applied to the interference pattern information 17 is extracted. An interference pattern information and compared cell list 17a is generated by combining the compared cell list 13 and the interference pattern information 17. As shown in FIG. 7, the interference pattern information and compared cell list 17a includes the designated cell 2-A tier 102a, a 3-A tier 103b, and the layers 20a, 20b, and 21b which overlap the outer portions of the designated cell 2-A tier 102a and outer portions of the 3-A tier 103b from the outside (areas in FIG. 7 enclosed by solid lines). A design rule verification section 16b verifies the layout data 12 and the interference pattern information and compared cell list 17a in accordance with the extracted interference pattern design rule 11a and outputs a verification result to a summary file 18.

The layout data 12 is compared with the compared cell list 13. Data in the layout data 12 which is not adaptable to the compared cell list 13 is extracted as inadaptable layout data 12a and data in the layout data 12 which is adaptable to the compared cell list 13 is extracted as adaptable layout data 12b. A design rule verification section 16d verifies the inadaptable layout data 12a and the adaptable layout data 12b by referring to the design rule 11 and outputs a verification result to the summary file 18.

As stated above, the layout data 12 is verified by the pattern matching verification system 15 and the physical verification system 16 and the verification results are outputted to the summary file 18. When circuit information is extracted and verified, a verification result is outputted to extracted circuit information 19.

With the verification system 10 according to the present invention, the pattern matching verification system 15 is located in front of the physical verification system 16. By doing so, the compared cell list 13 is referred to and adaptability verification of the layout data 12 and the comparison reference layout data 14 is performed. As a result, even if data in the layout data 12 corresponding to the compared cell list 13 is changed, the change can be checked.

In addition, the interference pattern information 17 is automatically extracted by the layout data and comparison reference layout data about compared cell list data adaptability verification section 15b in the pattern matching verification system 15 included in the verification system 10 according to the present invention. After that, the design rule verification section 16b included in the physical verification system 16 verifies the compared cell list 13 and the interference pattern information 17. As a result, interference necessary and unnecessary for the designated cell 2-A tier 102a and the tiers lower than the designated cell 2-A tier 102a can be checked. Interference with the designated cell 2-A tier 102a and the tiers lower than the designated cell 2-A tier 102a can be checked, so there is no need to set an interference area at the time of a layout.

If the LVS is used as the physical verification system 16 included in the verification system 10 according to the present invention, it is possible to separate circuit information corresponding to a tier extracted by the pattern matching verification system 15 from circuit information regarding a pattern which interferes with the tier. If interference occurs between data corresponding to a tier higher than a designated tier and data corresponding to a tier at which extraction begins, the conventional method does not clearly show which tier data that causes the interference belongs to. However, the verification system 10 according to the present invention enables a more correct extraction of circuit information.

With the verification system 10 according to the present invention, the layout data and comparison reference layout data about compared cell list data adaptability verification section 15b in the pattern matching verification system 15 may prepare in advance data verified and outputted. By doing so, an element having a complicated shape can be extracted. By parameterizing and registering the comparison reference layout data 14 and the data prepared in advance, data versatility can be obtained.

Moreover, even if part of a layout is formed on the basis of a plurality of design rules by combining these functions, a mechanism capable of performing verification can be built.

The verification system 10 according to the present invention may be operated in the following way.

By comparing only a designated cell included in the compared cell list 13 with the comparison reference layout data 14, it is possible to make the comparison reference layout data 14 versatile. Furthermore, a cell name included in the compared cell list 13 may be designated by using a wild card or the like. By doing so, part or all of the comparison reference layout data 14 can be parameterized. As a result, the amount of the comparison reference layout data 14 can be reduced. In addition, by making the comparison reference layout data 14 a database and encrypting it, the range of its use can be increased. For example, the comparison reference layout data 14 can be offered to external customers.

The design rule extraction section 16a extracts the interference pattern design rule 11a applied to the interference pattern information 17. However, a user may designate a design rule applied to the interference pattern information 17 or a design rule not applied to the interference pattern information 17 from the outside instead. In this case, this design rule can be used selectively. A design rule separately set may be applied only to a cell on which the pattern matching verification system 15 performs a process.

The following method may be adopted. An interference pattern which may overlap the outside and its coordinates are designated in advance. Whether the extracted interference pattern information 17 and its coordinate information match the interference pattern and its coordinates designated in advance is verified. By doing so, the interference pattern information 17 itself can be verified. This method is effective in checking wirings other than supposed terminals of a cell.

By using the function of verifying the interference pattern information 17 for field programmable gate arrays (FPGAs) or structured application specific integrated circuits (ASICs), their verification processes can significantly be reduced. Examples will be given.

The basic layout data 12 is registered as the compared cell list 13. The physical verification system 16 verifies the layout data 12 in advance. A user lays out a wiring area which can be laid out. The amount of layout data for this wiring area alone is very small compared with the amount of layout data for the whole of a layout. The basic layout data 12 is already verified. Therefore, if the physical verification system 16 verifies the completed layout of the wiring area alone, only verification of the wiring area can be performed selectively.

Verification can be performed in a short period of time after a revision of a layout by using the verification system 10 according to the present invention. For example, it is assumed that a portion to be revised is found as a result of verifying a layout by the verification system 10. After the portion is revised, verification must be performed again by the verification system 10. However, if only the portion to be revised can be verified selectively, verification can be performed in a short period of time. In this case, the layout before the revision is registered as the compared cell list 13 and the differential between the layout before the revision and the layout after the revision is extracted as interference information. By verifying only the interference information by the physical verification system 16 in accordance with a design rule, selective verification can be performed.

In the present invention, interference pattern information included in layout data can be outputted by the pattern matching verification system and an interference pattern design rule applied to the interference pattern information can be extracted from a design rule for general semiconductor integrated circuits by the physical verification system. By verifying the layout data, the interference pattern information, and a compared cell list by using the interference pattern design rule, a verification result can be outputted. By comparing the compared cell list and the layout data, inadaptable layout data which is not adaptable to the compared cell list and adaptable layout data which is adaptable to the compared cell list can be extracted. By verifying the inadaptable layout data and the adaptable layout data by using the design rule, a verification result can be outputted. As a result, the physical verification system can perform physical verification of the layout data without skipping data regarding the compared cell list.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device verification system for verifying layout data generated by layout design of a semiconductor device, the system comprising:

a pattern matching verification system to perform adaptability verification of the layout data and reference layout data including layout data for general semiconductor integrated circuits, about data included in a compared cell list including a cell extracted from the layout data and to output an adaptability verification result and interference pattern information, wherein the interference pattern information includes information on an interference pattern overlapping a cell designated in the compared cell list directly from outside the cell; and a physical verification system to extract an interference pattern design rule applied to the interference pattern information from a design rule for the general semiconductor integrated circuits, to output a verification result obtained by verifying the layout data, the interference pattern information, and the compared cell list with the interference pattern design rule, to extract inadaptable layout data not adaptable to the compared cell list and adaptable layout data adaptable to the compared cell list from the layout data by performing adaptability verification of the compared cell list and the layout data, and to output a verification result obtained by verifying the inadaptable layout data and the adaptable layout data with the design rule.

2. The semiconductor device verification system according to claim 1, wherein the pattern matching verification system is further configured to build a hierarchy by using data in the layout data and data in the reference layout data which match in the adaptability verification, and outputs data which interferes with the hierarchy.

3. The semiconductor device verification system according to claim 1, wherein:

a plurality of design rules are prepared; and the plurality of design rules are selectively used on the basis of the interference pattern information.

4. The semiconductor device verification system according to claim 1, wherein the reference layout data is stored in a database.

5. The semiconductor device verification system according to claim 1, wherein the pattern matching verification system is further configured to perform the adaptability verification only about a cell designated in the compared cell list.

6. The semiconductor device verification system according to claim 1, wherein part or all of the reference layout data is parameterized.

7. The semiconductor device verification system according to claim 1, wherein:
second interference pattern information which can overlap outside and coordinates of the second interference pattern information are prepared in advance; and
the pattern matching verification system is further configured to perform adaptability verification of the interference pattern information outputted and the second interference pattern information and adaptability verification of coordinates of the interference pattern information outputted and the coordinates of the second interference pattern information.

8. The semiconductor device verification system according to claim 1, wherein the physical verification system is a Design Rule Check (DRC).

9. The semiconductor device verification system according to claim 1, wherein the physical verification system is a Layout Versus Scheme (LVS).

10. The semiconductor device verification system according to claim 9, wherein circuit information is extracted by the LVS with a tier extracted by the pattern matching verification system as a reference point.

11. A semiconductor device fabrication method using a computer system to perform, the method as performed comprising:
performing adaptability verification of layout data and reference layout data including layout data for general semiconductor integrated circuits about data included in a compared cell list including a cell extracted from the layout data;
outputting an adaptability verification result and interference pattern information, wherein the interference pattern information includes information on an interference pattern overlapping a cell designated in the compared cell list directly from outside the cell;
extracting an interference pattern design rule applied to the interference pattern information from a design rule for the general semiconductor integrated circuits;
outputting a verification result obtained by verifying the layout data, the interference pattern information, and the compared cell list with the interference pattern design rule;
extracting inadaptable layout data not adaptable to the compared cell list and adaptable layout data adaptable to the compared cell list from the layout data by performing adaptability verification of the compared cell list and the layout data; and
outputting a verification result obtained by verifying the inadaptable layout data and the adaptable layout data with the design rule.

12. The semiconductor device fabrication method according to claim 11, further comprising:
building a hierarchy by using data in the layout data and data in the reference layout data which match in the adaptability verification, and outputs data which interferes with the hierarchy.

13. The semiconductor device fabrication method according to claim 11, further comprising:
preparing a plurality of design rules; and
selectively using the plurality of design rules on a basis of the interference pattern information.

14. The semiconductor device fabrication method according to claim 11, wherein the reference layout data is stored in a database.

15. The semiconductor device fabrication method according to claim 11, wherein the adaptability verification is performed only about a cell designated in the compared cell list.

16. The semiconductor device fabrication method according to claim 11, wherein part or all of the reference layout data is parameterized.

17. The semiconductor device fabrication method according to claim 11, further comprising:
preparing in advance second interference pattern information which overlap outside and coordinates of the second interference pattern information; and
performing adaptability verification of the interference pattern information outputted and the second interference pattern information and adaptability verification of coordinates of the interference pattern information outputted and the coordinates of the second interference pattern information.

18. The semiconductor device fabrication method according to claim 11, wherein the physical verification system is a Design Rule Check (DRC).

19. The semiconductor device fabrication method according to claim 11, wherein the physical verification system is a Layout Versus Scheme (LVS).

20. The semiconductor device fabrication method according to claim 19, wherein circuit information is extracted by the LVS with a tier extracted by the pattern matching verification system as a reference point.

* * * * *